United States Patent
Ko

(10) Patent No.: US 6,183,214 B1
(45) Date of Patent: Feb. 6, 2001

(54) COOLING FAN MOUNTING ARRANGEMENT

(75) Inventor: Ching-Rong Ko, Hsinchu (TW)

(73) Assignee: D-Link Corporation, Hsinchu (TW)

( * ) Notice: Under 35 U.S.C. 154(b), the term of this patent shall be extended for 0 days.

(21) Appl. No.: 09/366,633

(22) Filed: Aug. 4, 1999

(51) Int. Cl.⁷ ..................................................... F04B 17/00
(52) U.S. Cl. ...................... 417/360; 417/423.15; 361/695
(58) Field of Search ................................ 417/360, 423.5, 417/423.14, 423.7, 477.2; 361/695

(56) References Cited

U.S. PATENT DOCUMENTS

| | | | |
|---|---|---|---|
| 4,164,690 | * 8/1979 | Muller et al. | 318/254 |
| 5,917,698 | * 6/1999 | Viallet | 361/695 |
| 5,969,941 | * 10/1999 | Cho | 361/687 |
| 6,061,237 | * 5/2000 | Sands et al. | 361/695 |

* cited by examiner

*Primary Examiner*—Charles G. Freay
(74) *Attorney, Agent, or Firm*—Bacon & Thomas, PLLC

(57) ABSTRACT

A cooling fan mounting arrangement, which includes a fan rack fixedly fastened to the main board inside the housing of a network apparatus, and a fan supported on the fan rack, wherein the fan rack has a fan support frame obliquely raised from a flat mounting base frame thereof, and two angled suspension arms bilaterally raised from the fan support frame for holding the fan on the fan support frame, the suspension arms each having a retaining rod respectively engaged into a respective through hole at the fan to secure the fan in position.

3 Claims, 3 Drawing Sheets

COOLING FAN MOUNTING ARRANGEMENT

BACKGROUND OF THE INVENTION

The present invention relates to a cooling fan mounting arrangement for a network apparatus, and more particularly to such a cooling fan mounting arrangement which comprises a fan rack having an oblique fan support frame and angled suspension arms raised from the oblique fan support frame, and a fan supported on the oblique fan support frame and secured in place by the angled suspension arms and operated to induce currents of air for dissipating heat from the network apparatus.

Current network apparatus are designed to have as small a dimension as possible. In order to fit the tendency, the height of regular network apparatus is limited to IU (IU= 44.45 mm). Because a network apparatus produces much heat during its operation, heat dissipating means must be provided to dissipate heat quickly, enabling the temperature of the network apparatus to be constantly maintained below its maximum working temperature. Regular mini cooling fans for use in network apparatus commonly have three sizes, namely, 40 mm×40 mm×10 mm; 30 mm×30 mm×10 mm; 25 mm×25 mm×10 mm. A cooling fan of 40 mm×40 mm×10 mm achieves better heat dissipation effect than the other sizes. However, it cannot be used in a network apparatus of height below IU (IU=44.45 mm). Therefore, a network apparatus of height below IU can only be equipped with cooling fans of relatively smaller sizes. However, a cooling fan of relatively smaller size is more expensive than a cooling fan of relatively bigger size. Furthermore, when a cooling fan of 30 mm×30 mm×10 mm or 25 mm×25 mm×10 mm is used in a network apparatus, it produces high noise during its operation.

SUMMARY OF THE INVENTION

The present invention accomodates the aforementioned considerations and requirements. It is one object of the present invention to provide a cooling fan mounting arrangement for a network apparatus, which occupies less vertical installation space in the network apparatus. It is another object of the present invention to provide a cooling fan mounting arrangement for a network apparatus, which produces low noise during the operation of the fan. According to the present invention, the cooling fan mounting arrangement comprises a fan rack fixedly fastened to the main board inside the housing of a network apparatus, and a fan supported on the fan rack. The fan rack has a fan support frame obliquely raised from a flat mounting base frame thereof, and two angled suspension arms bilaterally raised from the fan support frame for holding the fan on the fan support frame. Further, the suspension arms each have a retaining rod respectively engaged into a respective through hole at the fan to secure the fan in position. Because the fan support frame holds the fan inside the housing of the network apparatus in a sloping position, the installation of the fan rack and the fan occupies less vertical space. Because the fan is not attached to the vertical peripheral wall of the housing of the network apparatus, induced currents of air smoothly flow out of the network apparatus without causing much noise.

DETAILED DESCRIPTION OF THE PREFERRED EMBODIMENT

Figure 1:
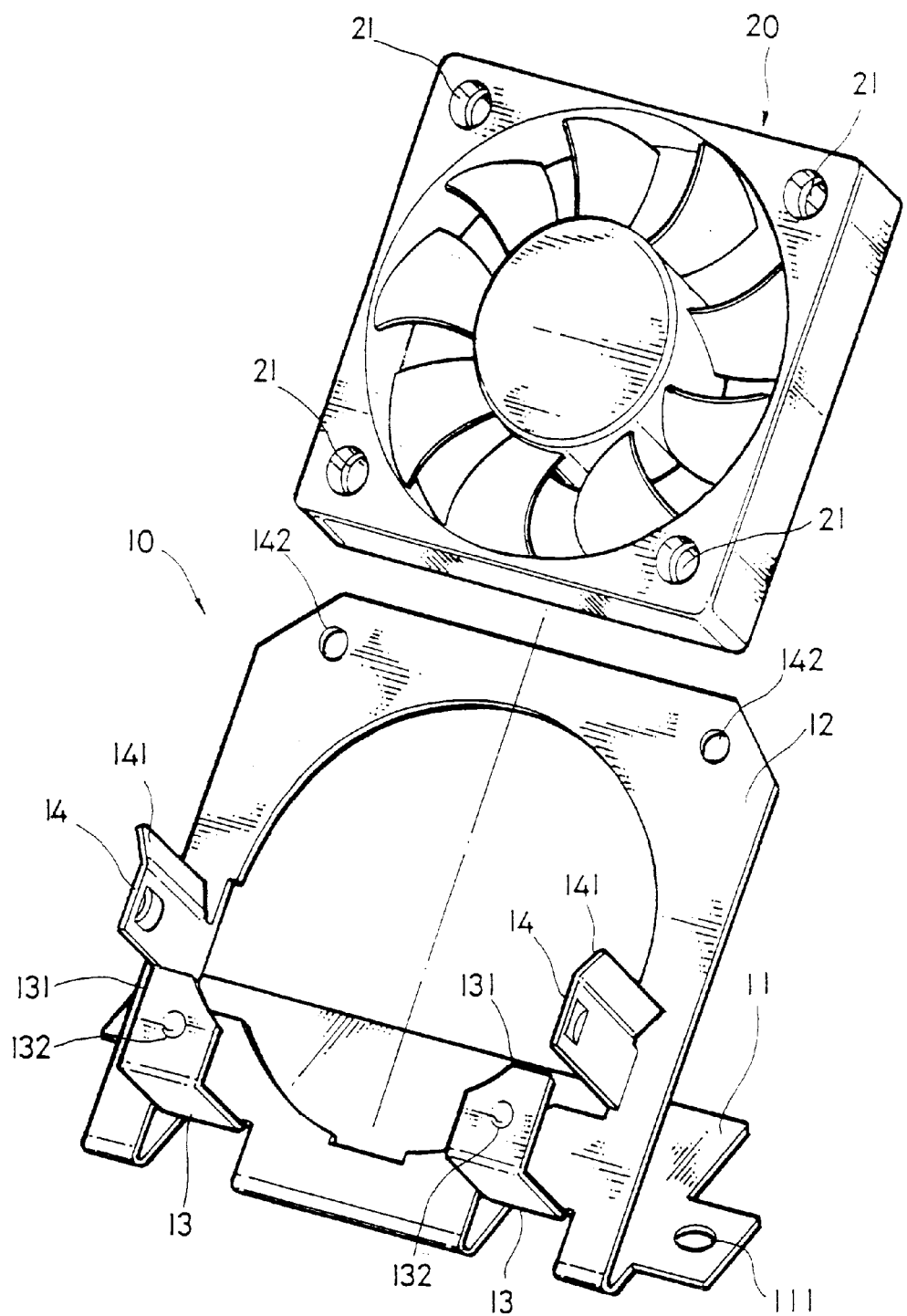
FIG. 1 is an exploded view of the present invention.

Referring to FIGS. from 1 through 3, a cooling fan mounting arrangement in accordance with the present invention comprises a fan rack 10, and a fan 20. The fan rack 10 comprises a flat mounting base frame 11, a flat fan support frame 12 formed integral with the flat mounting base frame 11. The flat mounting base frame 11 comprises two mounting holes 111 at two distal ends thereof. The fan support frame 12 is obliquely raised from the flat mounting base frame 11. In the preferred embodiment of the present invention, the angle of inclination of the fan support frame 12 is about 37.5° (see FIG. 1). At least one, for example, two suspension arms 13 are bilaterally and perpendicularly raised from a lower portion of the fan support frame 12 adjacent to the flat mounting base frame 11, each arm 13 having an upturned free end 131 disposed in parallel to the fan support frame 12, and a retaining device, for example, a retaining rod 132 provided at the free end 131 and upwardly directed towards the fan support frame 12 (see FIG. 1).

Two guide plates 14 extend perpendicularly from the fan support frame 12 in the same direction, and are disposed at two opposite sides of the opening defined at the center area of the fan support frame 12 adjacent to the suspension arms 13. The guide plates 14 each have an outwardly sloping guide portion 141. Two mounting holes 142 are bilaterally disposed at the fan support frame 12 near the top thereof and remote from the flat mounting base frame 11 (see FIG. 1).

Figure 2:
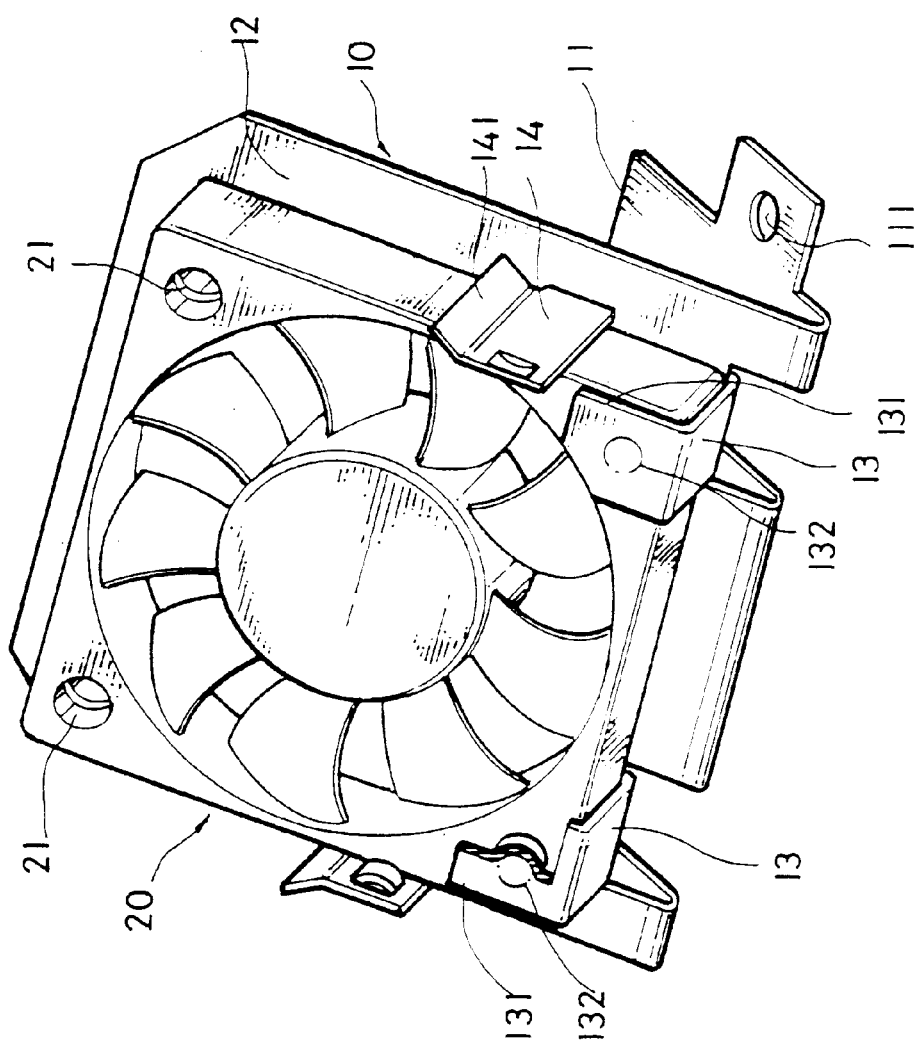
FIG. 2 is an assembly view of FIG. 1.

The fan 20 is inserted in the space defined between the guide plates 14 and the fan support frame 12, and held in place by the suspension arms 13. By means of the sloping guide portion 141 at each guide plate 14, the fan 20 is quickly guided into position during its insertion. The fan 20 comprises a through hole 21 in each of the four corners thereof. After insertion of the fan 20 into the space defined between the guide plates 14 and the fan support frame 12, the retaining rod 132 at each of the suspension arms 13 is respectively forced into engagement with a respective through hole 21 at the fan 20 (see FIG. 2), and the other two through holes 21 at the fan 20 are respectively fastened to the mounting holes 142 at the fan support frame 12 by a respective fastening element (not shown).

Figure 3:
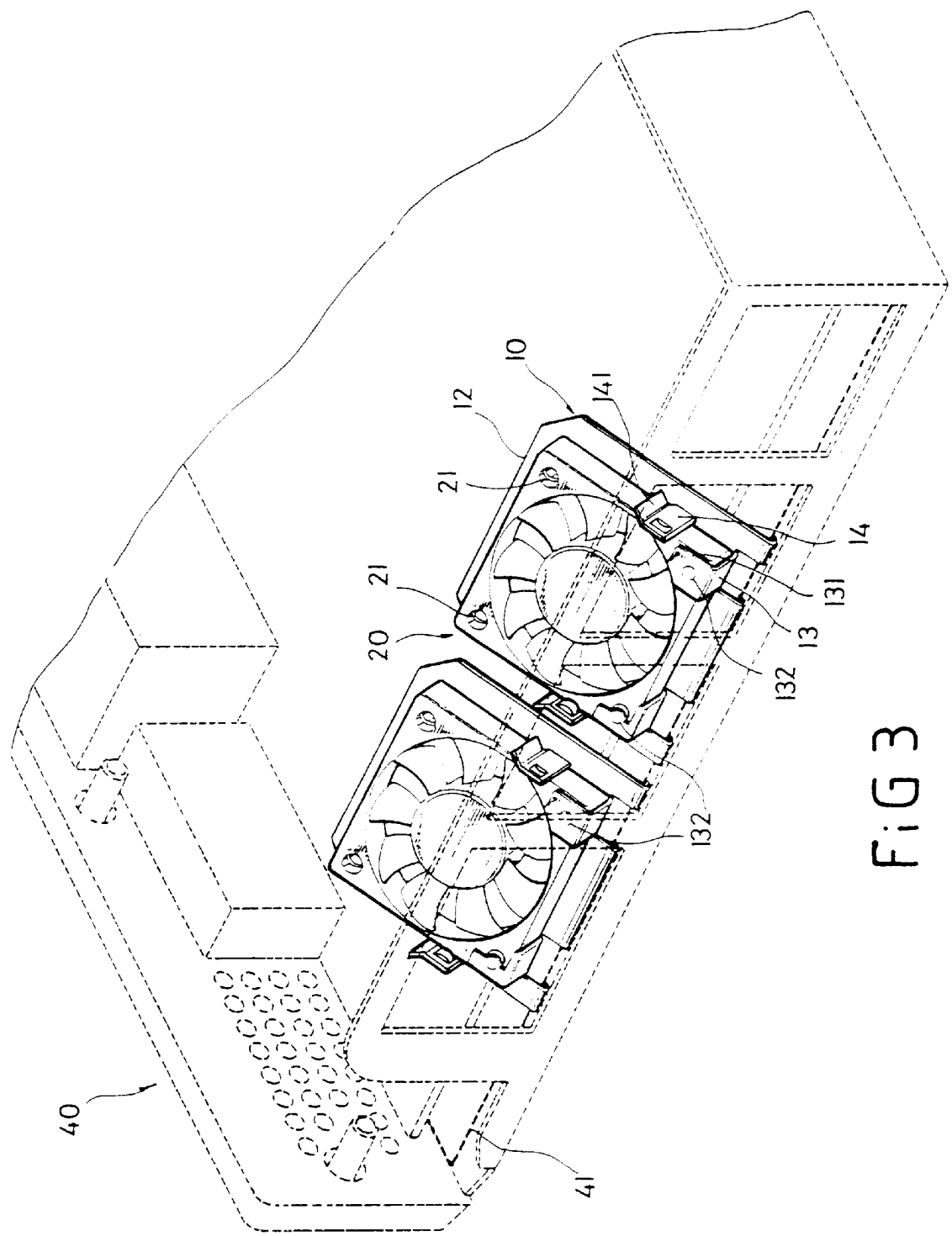
FIG. 3 is an applied view of the present invention, showing the cooling fan fixedly fastened to a main board inside the housing of a network apparatus.

Referring to FIG. 3, the assembly of the fan 20 and the fan rack 10 is mounted inside the housing 40 of a network apparatus (shown in phantom lines), enabling the mounting holes 111 at the flat mounting base frame 11 to be fixedly fastened to respective mounting holes (not shown) at the main board 41 in the housing 40 by a respective fastening element. The size of the fan 20 is designed subject to the size of the housing 40 of the network apparatus.

The aforesaid cooling fan mounting arrangement occupies less vertical installation space in the housing 40. Because the fan 20 is fixedly secured to the fan rack 10 but not directly secured to the side wall of the housing 40, induced currents of air quickly and smoothly flow out of the housing 40 to carry heat away from the network apparatus without creating much noise.

While only one embodiment of the present invention has been shown and described, it will be understood that various modifications and changes could be made thereunto without departing from the spirit and scope of the invention disclosed.

What the invention claimed is:

1. A cooling fan and rack assembly for mounting inside the housing of a network apparatus, the assembly comprising:
   a) a rack including a flat base frame, a flat support frame extending obliquely from the base frame and defining an inclined angle therewith, the support frame having a center opening formed therein;
   b) a pair of suspension arms extending perpendicularly and outwardly from the support frame, each suspension arm having an upturned free end disposed in parallel with the support frame, and each free end having a retaining device extending inwardly towards the support frame;
   c) a pair of guide plates extending outwardly from a pair of opposed sides of the support frame, each guide plate having an outwardly sloping guide portion; and
   d) a cooling fan disposed within a space collectively defined by the guide plates, suspension arms and support frame, the cooling fan including a first pair of through holes formed therein, and the retaining devices being engaged within the first pair of through holes for securing the fan to the rack.

2. The assembly of claim 1 wherein the support frame further includes a pair of mounting holes formed therein and the fan includes a second pair of through holes formed therein for receiving a pair of fastening elements to secure the fan to the rack.

3. The assembly of claim 1 wherein each retaining device is of a rod configuration.

* * * * *